United States Patent

Kanzaki et al.

[11] Patent Number: 5,205,878
[45] Date of Patent: * Apr. 27, 1993

[54] COPPER-BASED ELECTRIC AND ELECTRONIC PARTS HAVING HIGH STRENGTH AND HIGH ELECTRIC CONDUCTIVITY

[75] Inventors: Toshihiro Kanzaki, Akikawa; Akira Sugawara, Hachioji; Isamu Amatsu, Akikawa; Kouichi Hatakeyama, Hachioji, all of Japan

[73] Assignee: Dowa Mining Co., Ltd., Tokyo, Japan

[*] Notice: The portion of the term of this patent subsequent to Sep. 5, 2009 has been disclaimed.

[21] Appl. No.: 808,535

[22] Filed: Dec. 16, 1991

Related U.S. Application Data

[63] Continuation-in-part of Ser. No. 792,248, Nov. 14, 1991, Pat. No. 5,147,469.

Foreign Application Priority Data

Nov. 15, 1990 [JP] Japan ............................. 2-309032

[51] Int. Cl.$^5$ ............................................. C22C 9/06
[52] U.S. Cl. ................................. 148/684; 148/432; 420/469; 420/496
[58] Field of Search ............... 420/496, 469; 148/684, 148/432

[56] References Cited

U.S. PATENT DOCUMENTS 4,612,167 9/1986 Watanabe et al. ............... 420/487

Primary Examiner—R. Dean
Assistant Examiner—Sikyin Ip
Attorney, Agent, or Firm—Frishauf, Holtz, Goodman & Woodward

[57] ABSTRACT

Electric and electronic parts, including leadframes made of a copper-based alloy having high strength and high electric conductivity said copper-based alloy is produced by a process which comprises the steps of preparing a copper-based alloy consisting essentially of 0.01–3.0 wt % Co and 0.01–0.5 wt % P with the balance being Cu and incidental impurities, quenching said alloy from a temperature not lower than 750° C. down to 450° C. and below at a cooling rate of at least 1° C./sec, heat treating the quenched alloy at a temperature of 480°–600° C. for 30–600 minutes, cold working said alloy for a working ratio of 20–80%, further heat treating the alloy at a temperature of 440°–470° C. for 30–600 minutes, and subsequently performing cold working for a working ratio of at least 50% and heat treatment at 380° C. and below. The electric and electronic parts preferably contain a plurality of conductive leads.

8 Claims, 2 Drawing Sheets

COPPER-BASED ELECTRIC AND ELECTRONIC PARTS HAVING HIGH STRENGTH AND HIGH ELECTRIC CONDUCTIVITY

This application is a continuation-in-part application of application Ser. No. 07/792,248 filed Nov. 14, 1991 which issued as U.S. Pat. No. 5,147,469.

BACKGROUND OF THE INVENTION

This invention relates to a process for producing copper-based alloys having high strength and high electric conductivity that are suitable for use as materials in fabricating electric and electronic parts as typified by leadframes.

With the recent expansion of the electronics industry, the use of materials for electric and electronic parts such as leadframes has increased and they are required to have higher reliability in characteristics in addition to the need for lower costs.

The term "leadframe" as used herein means "a monolithic frame structure that supports IC leads during and after the frabrication of ICs". The leadframe is required to have the following characteristics:

(1) High Thermal and Electric Conductivity

One of the primary functions of the leadframe is to prevent the deterioration of Si chips by dissipating the heat generated in the chips. For efficient heat dissipation, the leadframe must have good thermal conductivity. In addition, it must have good electric conductivity in order to reduce the generation of heat in leads.

A linear relationship generally holds between thermal conductivity and electric conductivity, so the performance of the leadframe in this aspect can conveniently be evaluated by measuring its electric conductivity.

(2) High Strength

The leadframe must have sufficient strength to support IC leads during and after the fabrication of ICs. Criteria for evaluation of the leadframe in this aspect include high tensile strength, high proof stress and adequate stiffness.

(3) Adequate Heat Resistance

The leadframe may be subjected to some heating during or after the fabrication of ICs. Hence, the lead frame must have sufficient heat resistance to insure that its strength will not deteriorate under such thermal loads. In practice, however, in order to make leadframes having very high heat resistance, the temperature for annealing the frame material must be increased and other phenomena that are economically disadvantageous would occur. Hence, a leadframe that does not soften upon heating at 350° C. for several minutes will suffice for practical purposes.

(4) Good Workability for Bending

Most leadframes are worked for bending at the leads and hence good workability for bending is another requirement that must be satisfied by the leadframe. This property may be evaluated by a V/W bend test or an alternating bend test.

(5) Good Platability and Solderability

The leadframe is often plated with Ag/Au on the inner lead and solder on the outer lead. Therefore, good platability and solderability as well as the high weather resistance of the plate or solder are necessary for the leadframe.

The leadframe is required to possess the characteristics described above.

Cooper-based alloys such as brass, phosphor bronze, beryllium bronze, low tin copper and Fe-P containing copper are commonly used as materials for making electric and electronic parts that possess those necessary characteristics but all of them are short of completely satisfying the performance requirements for the leadframe.

Co-P containing copper has been proposed in Unexamined Published Japanese Patent Application Nos. 34632/1980, 44553/1980, etc. as an inexpensive copper-based alloy having superior characteristics. However, the so far proposed Co-P containing copper alloys are inappropriate in terms of either the Co and P contents or the thermo-mechanical treatment applied and, therefore, they have not possessed sufficiently good characteristics to justify their use as materials for electric and electronic parts such as leadframes.

SUMMARY OF THE INVENTION

The present invention has been accomplished under these circumstances, aiming at providing a copper-based alloy that possesses the above-described characteristics required for use as a material in making electric and electronic parts such as leadframes and, more particularly, a copper-based alloy that has high strength, high elasticity, good thermal (or electric) conductivity, as well as high heat resistance, good workability for bending and good platability or solderability and which hence is suitable for use as a material in making electric and electronic parts.

Namely, the present invention is to provide by a novel process for producing a copper-based alloy having high strength and high electric conductivity, which process comprises the steps of preparing a predetermined size of a copper-based alloy consisting essentially of 0.01–3.0 wt % Co and 0.01–0.5 wt % P with the balance being Cu and incidental impurities, quenching said alloy from a temperature not lowe than 750° C. down to 450° C. and below at a cooling rate of at least 1° C./sec, heat treating the as-quenched size of the alloy at a temperature of 480°–600° C. for 30–600 minutes, cold working the alloy for a working ratio of 20–80%, further heat treating the alloy at a temperature of 440°–470° C. for 30–600 minutes, and subsequently performing cold working and heat treatment at 380° C. and below for one or more cycles (to achieve a total cold working ratio of at least 50%) so as to finish the alloy to a final size.

The basic feature of the present invention lies in adding appropriate amounts of Co and P to a copper-based alloy of the specified composition and performing an appropriate thermo-mechanical treatment so that the fine grains of a Co-P based compound are uniformly precipitated in the Cu matrix, whereby a precipitation hardened copper-based alloy is produced that exhibits the aforementioned characteristics which are desired for the alloy to be used as a material in making electric and electronic parts such as leadframes.

DETAILED DESCRIPTION OF THE INVENTION

The criticality of the compositional ranges of the copper-based alloy of the present invention and the thermo-mechanical treatment to be preformed on that alloy are specifically described below.

Co:

Cobalt (Co) dissolves in the copper matrix to provide enhanced strength and elasticity. At the same time, Co combines with P to form a compound that is dispersed and precipitated in the matrix to achieve an improvement in thermal (or electric) conductivity and further improvements in strength and elasticity. Cobalt is also an element that contributes improved heat resistance. However, if the Co content is less than 0.01 wt %, the advantages mentioned above are not fully attainable. If, on the other hand, the Co content exceeds 3.0 wt %, significant deterioration of thermal (or electric) conductivity will occur even in the presence of P and, furthermore, an economic disadvantage will result as exemplified by an unduly high temperature for annealing the alloy. Therefore, the Co content of the alloy of the present invention is limited to lie within the range of 0.01–3.0 wt %.

P:

Phosphorus (P) works as a deoxidizer of molten metal. At the same time, it combines with Co to form a compound that is dispersed and precipitated to improve not only the thermal (or electric) conductivity of the resulting alloy but also its strength and elasticity. However, if the P content is less than 0.01 wt %, the advantages mentioned above are not fully attainable. If, on the other hand, the P content exceeds 0.5 wt %, significant deterioration of thermal (or electric) conductivity will occur even in the presence of Co and, furthermore, the hot workability of the alloy will be adversely affected. Therefore, the P content of the alloy of the present invention is limited to lie within the range of 0.01–0.5 wt %.

The copper-based alloy of the present invention may optionally contain at least one element selected from the group consisting of Zr, Fe, Mg, Zn, Sn, Ag, Cr, Si, B, Te, Ti, Ni, Be, Pb, Al, Ca, Mo, Mn, Cd, Ga, Ge and Bi in a total amount of less than 0.5 wt %. This is effective in achieving further improvements in the strength and elasticity of the alloy without substantially impairing its thermal (or electric) conductivity. Also, there is no possibility that other characteristics of the alloy are adversely affected. Therefore, copper based alloys containing one or more of those optional elements in addition to Co and P should also be regarded as falling within the category of the copper-based alloy of the present invention. Thermo-Mechanical Treatment:

The copper-based alloy having the composition described above is subjected to a thermo-mechanical treatment that starts with quenching a predetermined size of the alloy from a temperature not lower than 750° C. down to 450° C. and below at a cooling rate of at least 1° C./sec. This quenching step is essential for making a supersaturated solid solution of the matrix so that the fine grains of a Co-P based compound will be uniformly precipitated by the subsequent heat treatments. If the quench starting temperature is less than 750° C. or if the cooling rate is less than 1° C./sec, a fully supersaturated solid solution of the matrix cannot be formed and no matter how effectively the subsequent stages of thermo-mechanical treatment are performed, it is impossible to have the strength and electric conductivity exhibited in a balanced manner. If the quenching ends at a temperature higher than 450° C., a precipitate of coarse grains will occur at the end of quenching and no matter how effectively the subsequent stages of thermo-mechanical treatment are performed, it is also impossible to have the strength and electric conductivity exhibited in a balanced manner.

Subsequently, the copper-based alloy of the as-quenched size is subjected to a heat treatment under a temperature condition of 480°–600° C. for 30–600 minutes. This step is necessary for allowing the fine grains of a Co-P based compound to be precipitated uniformly. If the temperature for this heat treatment is less than 480° C., the desired precipitation will not occur. If the temperature for the heat treatment exceeds 600° C., re-dissolution of the precipitate will occur. Thus, in either case, it is impossible to have the strength and electric conductivity exhibited in a balanced manner no matter how effectively the subsequent stages of thermo-mechanical treatment are performed. Even if the temperature condition of 480°–600° C. is satisfied, the advantages of the present invention are not attained if the condition for the period of heat treatment is not satisfied. If it is shorter than 30 minutes, the desired precipitation will not occur and no matter how effectively the subsequent stages of thermo-mechanical treatment are performed, it is impossible to have the strength and electric conductivity exhibited in a balanced manner. On the other hand, no further precipitation will take place even if the heat treatment is performed for a period longer than 600 minutes and, hence, one cannot expect further improvements in the characteristics of the alloy. To the contrary, an economic disadvantage will result. Therefore, the upper limit of the duration of the heat treatment under consideration is set at 600 minutes.

In the next step, the copper-based alloy is subjected to cold working for a working ratio of 20–80% and then heat-treated at a temperature of 440°–470° C. for 30–600 minutes. This step is necessary for stimulating by cold working the components of the alloy that have not been completely precipitated by the preceding step of heat treatment, so that their precipitation is promoted to achieve improvement not only in electric conductivity but also in strength. If the cold working ratio is less than 20%, the desired acceleration of precipitation is not achieved. If the cold working ratio exceeds 80%, not only is it impossible for one to expect further acceleration of the precipitation but also the heat resistance of the finished product will deteriorate. Therefore, the cold working ratio is limited to lie within the range of 20–80%. If the temperature for the heat treatment following the cold working is less than 440° C., the desired precipitation will not occur. If the temperature for the heat treatment exceeds 470° C., the matrix will soften. In either case, it is impossible to have the strength and electric conductivity exhibited in a balanced manner no matter how effectively the subsequent stages of the thermo-mechanical treatment are performed. Even if the temperature condition of 440°–470° C. is satisfied, the advantages of the present invention are not attained if the condition for the period of heat treatment is not satisfied. If it is shorter than 30 minutes, the desired precipitation will not occur and no matter how effectively the subsequent stages of thermo-mechanical treatment are performed, it is impossible to have the strength and electric conductivity exhibited in a balanced manner. On the other hand, no further precipitation will take place even if the heat treatment is performed for a period longer than 600 minutes and, hence, one cannot expect further improvements in the characteristics of the alloy. To the contrary, an economic disadvantage will result. Therefore, the upper limit of the duration of the heat treatment following the cold working is set at 600 minutes.

In the last step, the copper-based alloy of interest is subjected to one or more cycles of cold working and heat treatment at 380° C. and below, whereby the alloy is finished size. The cold working in the last stage of the process of the present invention is performed to achieve a total working ratio of at least 50%. This last stage of the process of the present invention is necessary for having the desired characteristics exhibited by the final product of copper-based alloy, and the cold working step contributes particularly to an improvement of strength whereas the heat treatment step contributes to an improvement of workability for bending. If the total cold working ratio that can be achieved is less than 50%, the desired strength will not be exhibited. Therefore, the cold working ratio for the last stage of the process taken as a whole is set to be at least 50%. If the temperature for the heat treatment performed in the last stage of the process exceeds 380° C., the matrix will soften and its strength will deteriorate significantly. Therefore, the temperature for the heat treatment that is to be performed in the last stage of the process of the present invention is set at 380° C. and below.

For the reasons set forth above, the thermo-mechanical treatment to be conducted in the process of the present invention consists of the following steps: quenching a predetermined size of a copper-based alloy of the specified composition from a temperature not lower than 750° C. down to 450° C. and below at a cooling rate of at least 1° C./sec; heat treating the as-quenched size of the alloy at a temperature of 480°–600° C. for 30–600 minutes; cold working the alloy for a working ratio of 20–80%; further heat treating the alloy at a temperature of 440°–470° C. for 30–600 minutes; and subsequently performing cold working and heat treatment at 380° C. and below for one or more cycles (to achieve a total cold working ratio of at least 50%) so as to finish the alloy to a final size.

Electric and electronic parts as typified by having leadframes having improved balance of all the required characteristics inclusive of high thermal and electric conductivity, high strength, adequate heat resistance, good workability for bending as well as good platability and solderability can easily be prepared from the copper-based alloy produced by the process of the present invention.

"Leadframe" is a monolithic frame structure that supports IC leads before, during and after the fabrication of ICs. In particular, "leadframe" is a thin sheet of metal in the form of a frame structure comprising a large number of leads made in one piece. "Leadframe" is something like an openwork in its appearance, as shown in FIG. 1.

Figure 1:
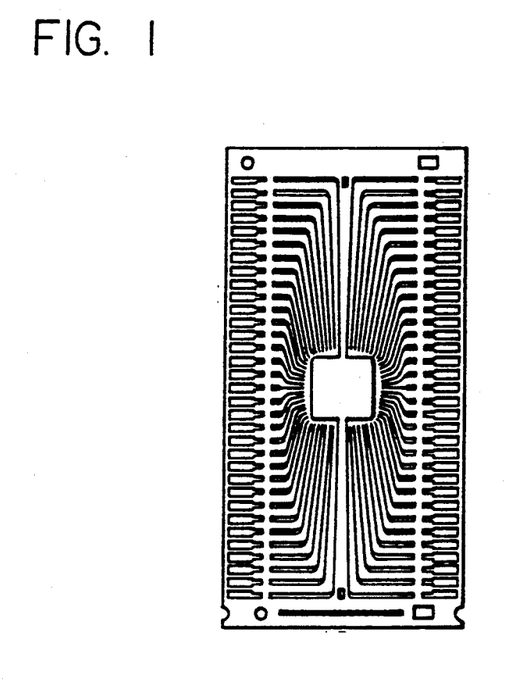
FIG. 1 is a plan view of one typical leadframe made of a copper-based alloy produced by the process of the present invention.
Figure 2:
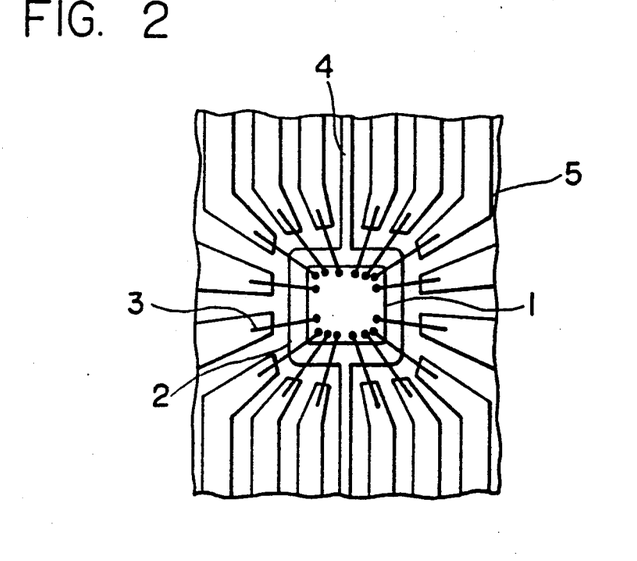
FIG. 2 is an enlarged plan view of the central area of an integrated circuit (IC) prepared by using the lead-frame shown in FIG. 1.

FIG. 2 shows an enlarged plan view of the central area of an IC made by using the leadframe shown in FIG. 1, in which a semiconductor chip 1 is mounted on a die pad 2 of the leadframe.

Figure 3:
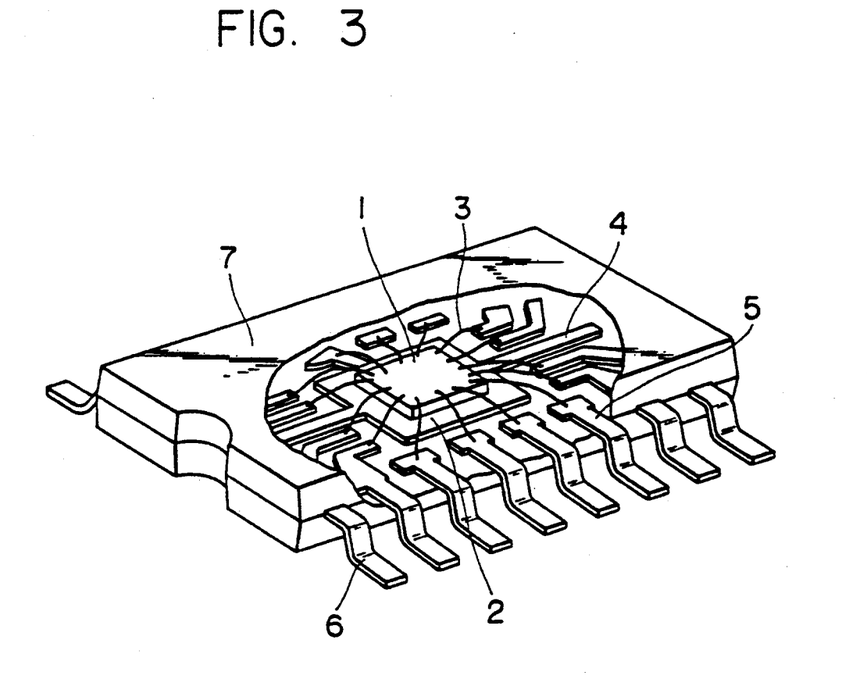
FIG. 3 is a partially open schematic view of the internal structure of the integrated circuit (IC) shown in FIG. 2.

FIG. 3 is a partially open schematic view of the internal structure of the IC shown in FIG. 2. In FIG. 3, 1 represents a semiconductor chip, 2 represents a die pad, 3 represents a bonding wire, which may be Au, Al or Cu, 4 represents a tie bar, 5 represents an inner lead, 6 represents an outer lead and 7 represents a resin mold.

The copper-based alloy produced by the process of the present invention can be used for electively conductive portions of other types of electronic and electric parts.

The following examples are provided for the purpose of further illustrating the present invention but are in no way to be taken as limiting.

EXAMPLE 1

Copper-based alloy sample Nos. 1–10 having the chemical compositions (wt %) shown in Table 1 were melted in a high-frequency melting furnace and cast into ingots each measuring 40×40×150 mm. The melting and casting operations were performed in an Ar gas sealed atmosphere.

A piece of 40×40×20 mm was cut out of each ingot from a position one-third of its thickness as measured from the bottom. The piece was then hot rolled at 850° C. to a thickness of 10 mm, followed by water quenching and pickling.

The thus hot rolled pieces were cold rolled to a thickness of 2.5 mm and heat treated at a temperature of 850° C. for 60 minutes, followed by water quenching and pickling. The cooling rate for the quenching step (over the temperature range of 750°–450° C.) was well in excess of 1° C./sec.

The pieces of the as-heat treated size were annealed at a temperature of 530° C. for 180 minutes, followed by water quenching and pickling.

In the next step, the heat-treated pieces were cold rolled to a thickness of 1.25 mm and annealed at a temperature of 460° C. for 150 minutes, followed by water quenching and pickling.

The heat-treated pieces were cold rolled to a thickness of 0.25 mm and annealed at a temperature of 290° C. for 180 minutes, followed by water quenching and pickling.

The thus treated pieces were conditioned for use in various tests and their hardness, tensile strength, electric conductivity, workability for bending and heat-resisting temperature were measured. The results are shown in Table 1.

Hardness, tensile strength and conductivity measurements were performed in accordance with JIS-Z-2244, JIS-Z-2241 and JIS-H-0505, respectively. Workability for bending was evaluated by a 90° W bend test (CES-M0002-6; R=0.1 mm; both in the rolling direction and in the direction perpendicular to it) and the results were rated by the following criteria: ◯, the center ridge had a smooth surface; Δ, wrinkles occurred; X, cracks occured. The heat resistance test was conducted by measuring the temperature at which the hardness of each sample dropped to 80% of the initial value (after holding for 30 min).

The data in Table 1 show that the copper-based alloy sample Nos. 1–6 prepared in accordance with the present invention were characterized by a good balance between hardness, tensile strength and electric conductivity and that they also had satisfactory workability for bending and heat resistance. It is therefore concluded that those copper-based alloys have very good characteristics that make them suitable for use as materials in the making of electric and electronic parts such as leadframes.

In contrast, comparative alloy sample No. 7 which was substantially free of Co had high electric conductivity but it was not satisfactory in terms of hardness, strength and heat resistance. Comparative alloy sample No. 8 which was substantially free of P and comparative alloy sample No. 9 which contained more Co than specified by the present invention had high hardness and strength but, on the other hand, they were low in electric conductivity. Comparative sample No. 9 also experienced deterioration in the workability for bending. Hence, none of those comparative alloys had satisfactory characteristics for use as materials in the making of electric and electronic parts such as leadframes.

As for comparative alloy sample No. 10 which contained more P than specified by the present invention, cracking occurred during hot rolling operations and no further experiment could be performed.

EXAMPLE 2

Test pieces of a copper-based alloy having the chemical composition indicated for sample No. 3 in Table 1 in Example 1 were prepared by the following schemes A–O of thermo-mechanical treatment and the hardness, tensile strength, electric conductivity, workability for bending and heat-resisting temperature of each of those test pieces were measured by the same test methods as employed in Example 1. The results are shown in Table 2.

Each of the schemes A–O of thermo-mechanical treatment was applied to a copper-based alloy having the predetermined chemical composition (wt %) that had been melted in a high-frequency melting furnace in Ar gas atmosphere and cast into an ingot measuring 40×40×150 mm.

Scheme A: Same as in Example 1 (in accordance with the present invention)

A piece of 40×40×20 mm was cut out of the ingot from a position one-third of its thickness as measured from the bottom. The piece was then hot rolled at 850° C. to a thickness of 10 mm, followed by water quenching and pickling.

The thus hot rolled piece was cold rolled to a thickness of 2.5 mm and heat treated at a temperature of 850° C. for 60 minutes, followed by water quenching and pickling. The cooling rate for the quenching step (over the temperature range of 750°–450° C.) was well in excess of 1° C./sec.

The piece of the as-heat treated size was annealed at a temperature of 530° C. for 180 minutes, followed by water quenching and pickling.

In the next step, the heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme B: Example of the Present Invention

A piece of 40×40×20 mm was cut out of the ingot from a position one-third of its thickness as measured from the bottom. The piece was then hot rolled at 850° C. to a thickness of 2.5 mm, followed by water quenching and pickling. The quench starting temperature was not lower than 750° C. and the cooling rate (over the temperature range of 750°–450° C.) was well in excess of 1° C./sec.

The piece of the as-hot rolled size was annealed at a temperature of 530° C. for 180 minutes, followed by water quenching and pickling.

The thus heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme C: Example of the Present Invention

A piece of 40×40×20 mm was cut out of the ingot from a position one-third of its thickness as measured from the bottom. The piece was then hot rolled at 850° C. to a thickness of 10 mm, followed by water quenching and pickling. The quench starting temperature was not lower than 750° C. and the cooling rate (over the temperature range of 750°–450° C.) was well in excess of 1° C./sec.

The piece of the as-hot rolled size was annealed at a temperature of 530° C. for 180 minutes, followed by water quenching and pickling.

The thus heat-treated piece was cold rolled to a thickness of 2.5 mm and annealed at a temperature of 460° C. for 150 minutes, followed by water quenching and pickling.

The heat-treated piece was then cold rolled to a thickness of 1.25 mm and annealed at a temperature of 350° C. for 180 minutes, followed by water quenching and pickling.

The heat-treated piece was further cold rolled to a thickness of 0.25 mm and annealed at a temperature of 290° C. for 180 minutes, followed by water quenching and pickling.

Scheme D: Comparative Example

A piece of 40×40×20 mm was cut out of the ingot from a position one-third of its thickness as measured from the bottom. The piece was then cold rolled to a thickness of 2.5 mm without heat treatment and the piece of the as-rolled size was annealed at a temperature of 530° C. for 180 minutes, followed by water quenching and pickling.

The thus heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme E: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus heat-treated piece was cold rolled to a thickness of 2.5 mm and heat treated at a temperature of 850° C. for 60 minutes, followed by furnace cooling and pickling. The cooling rate (over the temperature range of 750°–450° C.) was well short of 1° C./sec.

The piece of as-heat treated size was annealed at a temperature of 530° C. for 180 minutes, followed by water quenching and pickling.

In the next step, the heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme F: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus heat-treated piece was cold rolled to a thickness of 2.5 mm and heat treated at a temperature of 850° C. for 60 minutes, followed by water quenching and pickling. The cooling rate (over the temperature range of 750°–450° C.) was well in excess of 1° C./sec.

In the next step, the heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme G: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus hot-rolled piece was cold rolled to a thickness of 2.5 mm and heat treated at a temperature of 850° C. for 60 minutes, followed by water quenching and pickling. The cooling rate (over the temperature range of 750°–450° C.) was well in excess of 1° C./sec.

The piece of as-heat treated size was annealed at a temperature of 430° C. for 180 minutes, followed by water quenching and pickling.

In the next step, the heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme H: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus hot-rolled piece was cold rolled to a thickness of 2.5 mm and heat treated at a temperature of 850° C. for 60 minutes, followed by water quenching and pickling. The cooling rate (over the temperature range of 750°–450° C.) was well in excess of 1° C./sec.

The piece of the as-heat treated size was annealed at a temperature of 650° C. for 180 minutes, followed by water quenching and pickling.

In the next step, the heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme I: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus hot-rolled piece was cold rolled to a thickness of 1.5 mm and heat treated at a temperature of 850° C. for 60 minutes, followed by water quenching and pickling. The cooling rate (over the temperature range of 750°–450° C.) was well in excess of 1° C./sec.

The piece of the as-heat treated size was annealed at a temperature of 530° C. for 180 minutes, followed by water quenching and pickling.

In the next step, the heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme J: Comparative Example

A piece of 40×40×20 mm was cut out of the ingot from a position one-third of its thickness as measured from the bottom. The piece was then hot rolled at 850° C. to a thickness of 10 mm, followed by water quenching and pickling. The quench starting temperature was not lower than 750° C. and the cooling rate (over the temperature range of 750°–450° C.) was well in excess of 1° C./sec.

The piece of the as-hot rolled size was annealed at a temperature of 530° C. for 180 minutes, followed by water quenching and pickling.

The thus heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme K: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus hot-rolled piece was cold rolled to a thickness of 2.5 mm and heat treated at a temperature of 850° C. for 60 minutes, followed by water quenching and pickling. The cooling rate (over the temperature range of 750°–450° C.) was well in excess of 1° C./sec.

The piece of the as-heat treated size was annealed at a temperature of 530° C. for 180 minutes, followed by water quenching and pickling.

In the next step, the heat-treated piece was cold rolled to a thickness of 1.25 mm and annealed at a temperature of 400° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme L: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus hot-rolled piece was cold rolled to a thickness of 2.5 mm and heat treated at a temperature of 850° C. for 60 minutes, followed by water quenching and pickling. The cooling rate (over the temperature range of 750°–450° C.) was well in excess of 1° C./sec.

The piece of the as-heat treated size was annealed at a temperature of 530° C. for 180 minutes, followed by water quenching and pickling.

In the next step, the heat-treated piece was cold rolled to a thickness of 1.25 mm and annealed at a temperature of 500° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme M: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus hot-rolled piece was cold rolled to a thickness of 0.80 mm and heat treated at a temperature of 850° C. for 60 minutes, followed by water quenching and pickling. The cooling rate (over the temperature range of 750°–450° C.) was well in excess of 1° C./sec.

The piece of the as-heat treated size was annealed at a temperature of 530° C. for 180 minutes, followed by water quenching and pickling.

In the next step, the heat-treated piece was cold rolled to a thickness of 0.40 mm and annealed at a temperature of 460° C. for 150 minutes, followed by water quenching and pickling.

The heat-treated piece was further cold rolled to a thickness of 0.25 mm and annealed at a temperature of 290° C. for 180 minutes, followed by water quenching and pickling.

Scheme N: Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus hot-rolled piece was cold rolled to a thickness of 2.5 mm and heat treated at a temperature of 850° C. for 60 minutes, followed by water quenching and pickling. The cooling rate (over the temperature range of 750°–450° C.) was well in excess of 1° C./sec.

The piece of the as-heat treated size was annealed at a temperature of 530° C. for 180 minutes, followed by water quenching and pickling.

In the next step, the heat-treated piece was cold rolled to a thickness of 1.25 mm and annealed at a temperature of 460° C. for 150 minutes, followed by water quenching and pickling.

The heat-treated piece was further cold rolled to a thickness of 0.25 mm and immediately finished without heat treatment.

Scheme O : Comparative Example

A piece of 40×40×20 mm was cut out of the ingot from a position one-third of its thickness as measured from the bottom. The piece was then hot rolled at 850° C. to a thickness of 10 mm, followed by water quenching and pickling.

The thus hot-rolled piece was cold rolled to a thickness of 2.5 mm and heat treated at a temperature of 850° C. for 60 minutes, followed by water quenching and pickling. The cooling rate (over the temperature range of 750°–450° C.) was well in excess of 1° C./sec.

The piece of the as-heat treated size was annealed at a temperature of 530° C. for 180 minutes, followed by water quenching and pickling.

The heat-treated piece was then cold rolled to a thickness of 1.25 mm and annealed at a temperature of 460° C. for 150 minutes, followed by water quenching and pickling.

The heat treated piece was further cold rolled to a thickness of 0.25 mm and annealed at a temperature of 400° C. for 180 minutes, followed by water quenching and pickling.

The data in Table 2 show that the alloys treated by schemes A, B and C in accordance with the present invention had a good balance between hardness, tensile strength and electric conductivity while exhibiting satisfactory workability for bending and heat resistance. In other words, those alloys have excellent characteristics that make them suitable for use as materials in the making of electric and electronic parts such as leadframes.

On the other hand, the alloys treated by comparative scheme D (no solution treatment included), comparative scheme E (the cooling rate was insufficient to achieve solution treatment), comparative scheme F (the first heat treatment following the solution treatment was not performed), comparative scheme G (the first heat treatment following the solution treatment was performed at a lower temperature than specified by the present invention) and comparative scheme I (the cold rolling between the first and second heat treatments following the solution treatment achieved a lower working ratio than specified by the present invention) deteriorated in hardness, strength and electric conductivity. The alloys treated by comparative scheme H (the first heat treatment following the solution treatment was performed at a higher temperature than specified by the present invention), comparative scheme J (the cold rolling between the first and second heat treatments following the solution treatment achieved a higher working ratio than specified by the present invention), comparative scheme L (the second heat treatment following the solution treatment was performed at a higher temperature than specified by the present invention), comparative scheme M (the cold rolling in the last stage achieved a lower working ratio than specified by the present invention) and comparative scheme O (the heat treatment in the last stage was performed at a higher temperature than specified by the present invention) experienced particularly great deterioration in hardness and strength without any improvement in electric conductivity that was sufficient to compensate for that deterioration. The alloy treated by comparative scheme K (the second heat treatment following the solution treatment was performed at a lower temperature than specified by the present invention) experienced particularly great deterioration in electric conductivity without any improvement in hardness and strength that was sufficient to compensate for that deterioration. The alloy treated by comparative scheme N (no heat treatment was performed in the last stage) broke in the bend test and similar deterioration in the workability for bending also occurred in the alloys treated by comparative schemes E, F, G and K. The alloys treated by comparative schemes F, G, J and L were poor in heat resistance. Hence, none of the alloys treated by the comparative schemes had satisfactory characteristics that made them suitable for use as materials in the making of electric and electronic parts such as leadframes.

EXAMPLE 3

Alloy sample No. 3 (as treated by scheme A) shown in Table 1 in Example 1 and a commercial copper of low tin content (C50500EH: 1.25 wt % Sn and the balance Cu) were tested or measured for hardness, tensile strength, electric conductivity, heat-resisting property, workability for bending, weather resistance of solder and plate adhesion. The results are shown in Table 3.

Hardness, tensile strength, conductivity, workability for bending and heat-resisting temperature measurements were conducted by the same methods as in Example 1. The weather resistance of solder was evaluated by the following procedure: a molten solder was plated onto each test piece (dipped in Sn-40% Pb at 260° C.×5 sec using a weakly active rosin flux); after holding at 200° C. for 1,000 h, the test piece was subjected to 90° W bend and the bent areas were examined. The result was rated by the following criteria: ○, the plate remained firmly adherent; X, plate delamination occurred. The plate adhesion was evaluated by the following method: each test piece was plated with a 3-μm thick Ag layer; after holding at 500° C. for 10 min, the surface of the plate was visually checked and the result was rated by the following criteria: X, blistering occurred; ○, no blistering occurred.

The data in Table 3 show that the copper-based alloy of the present invention was far superior in hardness, strength, electric conductivity and heat resistance than the copper of low tin content which is a typical conventional material for electric and electronic parts such as leadframes. Hence, it is obvious that the copper-based alloy of the present invention is an excellent material for making electric and electronic parts such as leadframes compared to the copper of low tin content and other conventional materials.

As one can see from the above-described examples, the copper-based alloy of the present invention has high strength, high elasticity and high thermal (or electric) conductivity, as well as good workability, strong plate adhesion and high heat resistance. While this alloy is applicable to various uses, it is particularly suitable for use as a material in the making of electric and electronic parts such as leadframes. The appropriate compositional ranges of this copper-based alloy of high strength and electric conductivity, as well as the process for its production have been specifically disclosed hereinabove.

TABLE 1

| Alloy | Composition (wt %) | | | Hardness Hv | Tensile Strength | Electric conductivity | Workability for Bending | Heat-Resisting Temperature (°C.) |
| --- | --- | --- | --- | --- | --- | --- | --- | --- |
| | Co | P | Cu | | | | | |
| Invention | | | | | | | | |
| 1 | 0.083 | 0.034 | bal. | 145 | 49.1 | 91.3 | ○ | 380 |
| 2 | 0.156 | 0.060 | bal. | 159 | 54.3 | 87.8 | ○ | 410 |
| 3 | 0.302 | 0.083 | bal. | 172 | 58.9 | 81.2 | ○ | 440 |
| 4 | 0.610 | 0.103 | bal. | 182 | 61.0 | 76.7 | ○ | 460 |
| 5 | 1.211 | 0.216 | bal. | 197 | 63.2 | 66.5 | ○ | 490 |
| 6 | 2.309 | 0.425 | bal. | 213 | 65.8 | 57.2 | ○ | 520 |
| Comparative Samples | | | | | | | | |
| 7 | <0.002 | 0.146 | bal. | 110 | 33.6 | 72.6 | ○ | 310 |
| 8 | 0.653 | <0.001 | bal. | 159 | 49.2 | 42.1 | ○ | 450 |
| 9 | 4.258 | 0.076 | bal. | 184 | 60.2 | 31.2 | Δ | 510 |
| 10 | 0.631 | 0.645 | bal. | cracking occurred during hot rolling | | | | |

TABLE 2

| Heat Treatment | Composition (wt %) | | | Hardness Hv | Tensile Strength | Electric conductivity | Workability for Bending | Heat-Resisting Temperature (°C.) |
| --- | --- | --- | --- | --- | --- | --- | --- | --- |
| | Co | P | Cu | | | | | |
| Invention | | | | | | | | |
| A | 0.302 | 0.083 | bal. | 172 | 58.9 | 81.2 | ○ | 440 |
| B | 0.301 | 0.079 | bal. | 174 | 59.5 | 80.1 | ○ | 430 |
| C | 0.301 | 0.082 | bal. | 175 | 60.1 | 80.9 | ○ | 440 |
| Comparative Samples | | | | | | | | |
| D | 0.302 | 0.080 | bal. | 142 | 45.8 | 68.0 | ○ | 380 |
| E | 0.302 | 0.082 | bal. | 156 | 51.0 | 75.6 | Δ | 370 |
| F | 0.300 | 0.080 | bal. | 158 | 51.4 | 74.3 | Δ | 340 |
| G | 0.302 | 0.083 | bal. | 154 | 50.6 | 74.9 | Δ | 340 |
| H | 0.300 | 0.081 | bal. | 127 | 39.2 | 81.3 | ○ | 420 |

TABLE 2-continued

| Heat Treatment | Composition (wt %) Co | P | Cu | Hardness Hv | Tensile Strength | Electric conductivity | Workability for Bending | Heat-Resisting Temperature (°C.) |
|---|---|---|---|---|---|---|---|---|
| I | 0.299 | 0.080 | bal. | 135 | 42.1 | 74.2 | ○ | 420 |
| J | 0.303 | 0.084 | bal. | 146 | 47.2 | 80.6 | ○ | 330 |
| K | 0.301 | 0.082 | bal. | 162 | 55.6 | 73.6 | △ | 430 |
| L | 0.301 | 0.082 | bal. | 133 | 41.7 | 80.5 | ○ | 340 |
| M | 0.302 | 0.083 | bal. | 101 | 33.3 | 80.7 | ○ | 440 |
| N | 0.301 | 0.081 | bal. | 174 | 57.5 | 79.0 | X | 420 |
| O | 0.300 | 0.080 | bal. | 130 | 40.4 | 81.8 | ○ | 440 |

TABLE 3

| Test Alloy | Hardness Hv | Tensile Strength | Electric conductivity | Heat-Resisting Temperature (°C.) | Workability for Bending | Weather Resistance of Solder | Plate Adhesion |
|---|---|---|---|---|---|---|---|
| Alloy No. 3 of the Invention | 172 | 58.9 | 81.2 | 440 | ○ | ○ | ○ |
| C5050EH | 158 | 52.7 | 42.0 | 330 | ○ | ○ | ○ |

What is claimed is:

1. An integrated circuit leadframe made of a copper-based alloy having high strength and high electric conductivity, said copper-based alloy being produced by a process which comprises the steps of preparing a copper-based alloy consisting essentially of 0.01–3.0 wt % Co and 0.01–0.5 wt % P with the balance being Cu and incidental impurities, quenching said alloy from a temperature not lower than 750° C. down to 450° C. and below at a cooling rate of at least 1° C./sec, heat treating the quenched alloy at a temperature of 480°–600° C. for 30–600 minutes, cold working said alloy for a working ratio of 20–80%, further heat treating the alloy at a temperature of 440°–470° C. for 30–600 minutes, and subsequently performing cold working for a working ratio of at least 50% and heat treatment at 380° C. and below.

2. An integrated circuit leadframe made of a copper-based alloy having high strength and high electric conductivity, said copper-based alloy being produced by a process which comprises the steps of preparing a copper-based alloy consisting essentially of 0.01–3.0 wt % Co, 0.01–0.5 wt % P and less than 0.5 wt % in total of at least one element selected from the group consisting of Zr, Fe, Mg, Zn, Sn, Ag, Cr, Si, B, Te, Ti, Ni, Be, Pb, Al, Ca, Mo, Mn, Cd, Ga, Ge and Bi with the balance being Cu and incidental impurities, quenching said alloy from a temperature not lower than 750° C. down to 450° C. and below at a cooling rate of at least 1° C./sec, heat treating the quenched alloy at a temperature of 480°–600° C. for 30–600 minutes, cold working said alloy for a working ratio of 20–80%, further heat treating the alloy at a temperature of 440°–470° C. for 30–600 minutes, and subsequently performing cold working for a working ratio of at least 50% and heat treatment at 380° C. and below.

3. An electric or electronic part which comprises a plurality of electrically conductive leads made of a copper-based alloy having high strength and high electric conductivity, said copper-based alloy being produced by a process which comprises the steps of preparing a copper-based alloy consisting essentially of 0.01–3.0 wt % Co and 0.01–0.5 wt % P with the balance being Cu and incidental impurities, quenching said alloy from a temperature not lower than 750° C. down to 450° C. and below at a cooling rate of at least 1° C./sec, heat treating the quenched alloy at a temperature of 480°–600° C. for 30–600 minutes, cold working said alloy for a working ratio of 20–80%, further heat treating the alloy at a temperature of 440°–470° C. for 30–600 minutes, and subsequently performing cold working for a working ratio of at least 50% and heat treatment at 380° C. and below.

4. The electric or electronic part of claim 3 which is an electric part.

5. The electric or electronic part of claim 3 which is an electronic part.

6. An electric or electronic part which comprises a plurality of electrically conductive leads made of a copper-based alloy having high strength and high electric conductivity, said copper-based alloy being produced by a process which comprises the steps of preparing a copper-based alloy consisting essentially of 0.01–3.0 wt % Co, 0.01–0.5 wt % P and less than 0.5 wt % in total of at least one element selected from the group consisting of Zr, Fe, Mg, Zn, Sn, Ag, Cr, Si, B, Te, Ti, Ni, Be, Pb, Al, Ca, Mo, Mn, Cd, Ga, Ge and Bi with the balance being Cu and incidental impurities, quenching said alloy from a temperature not lower than 750° C. down to 450° C. and below at a cooling rate of at least 1° C./sec, heat treating the quenched alloy at a temperature of 480°–600° C. for 30–600 minutes, cold working said alloy for a working ratio of 20–80%, further heat treating the alloy at a temperature of 440°–470° C. for 30–600 minutes, and subsequently performing cold working for a working ratio of at least 50% and heat treatment at 380° C. and below.

7. The electric or electronic part of claim 6 which is an electric part.

8. The electric or electronic part of claim 6 which is an electronic part.

* * * * *